United States Patent
Savariar-Hauck et al.

(10) Patent No.: US 7,563,556 B2
(45) Date of Patent: Jul. 21, 2009

(54) MULTILAYER ELEMENT WITH LOW PH DEVELOPER SOLUBILITY

(75) Inventors: Celin Savariar-Hauck, Badenhausen (DE); Gerhard Hauck, Badenhausen (DE)

(73) Assignee: Kodak Graphic Communications GmbH, Osterode (DE)

( * ) Notice: Subject to any disclaimer, the term of this patent is extended or adjusted under 35 U.S.C. 154(b) by 162 days.

(21) Appl. No.: 11/560,983

(22) Filed: Nov. 17, 2006

(65) Prior Publication Data

US 2008/0118868 A1 May 22, 2008

(51) Int. Cl.
*G03F 7/00* (2006.01)
*G03F 7/004* (2006.01)

(52) U.S. Cl. ............... 430/270.1; 430/302; 430/905

(58) Field of Classification Search ........... 430/302, 430/270.1, 905
See application file for complete search history.

(56) References Cited

U.S. PATENT DOCUMENTS

| | | | |
|---|---|---|---|
| 4,943,511 A * | 7/1990 | Lazarus et al. | 430/192 |
| 4,957,846 A * | 9/1990 | Jeffries et al. | 430/165 |
| 5,089,373 A * | 2/1992 | Uenishi et al. | 430/191 |
| 5,290,658 A * | 3/1994 | Uenishi et al. | 430/192 |
| 5,773,200 A * | 6/1998 | Okazaki et al. | 430/324 |
| 6,200,727 B1 | 3/2001 | Urano et al. | |
| 6,294,311 B1 | 9/2001 | Shimazu et al. | |
| 6,358,668 B1 * | 3/2002 | Leenders et al. | 430/271.1 |
| 6,358,669 B1 | 3/2002 | Savariar-Hauck et al. | |
| 6,534,238 B1 | 3/2003 | Savariar-Hauck et al. | |
| 6,555,291 B1 | 4/2003 | Hauck | |
| 6,680,161 B2 * | 1/2004 | Oohashi | 430/273.1 |
| 2003/0172828 A1 | 9/2003 | Tabuchi et al. | |
| 2004/0009363 A1 * | 1/2004 | Shouldice et al. | 428/523 |
| 2005/0008965 A1 * | 1/2005 | Tao et al. | 430/270.1 |
| 2005/0019706 A1 | 1/2005 | Patel et al. | |
| 2005/0037280 A1 * | 2/2005 | Loccufier et al. | 430/270.1 |
| 2005/0162505 A1 | 7/2005 | Shimazu et al. | |

FOREIGN PATENT DOCUMENTS

| | | |
|---|---|---|
| EP | 1 319 504 A2 | 6/2003 |
| JP | 04153213 A * | 5/1992 |
| JP | 2005092037 A * | 4/2005 |
| WO | WO2005/101126 | 10/2005 |

* cited by examiner

*Primary Examiner*—Amanda C. Walke
(74) *Attorney, Agent, or Firm*—J. Lanny Tucker

(57) ABSTRACT

A positive-working imageable element comprises inner and outer layers and an infrared radiation absorbing compound such as an IR absorbing dye. The ink receptive outer layer includes a phenolic polymeric binder that is soluble in a developer having a pH of from about 7 to about 11. The use of this type of polymeric binder reduces residue in the developer as elements are processed.

11 Claims, No Drawings

MULTILAYER ELEMENT WITH LOW PH DEVELOPER SOLUBILITY

FIELD OF THE INVENTION

This invention relates to a method of making lithographic printing plates from multilayer positive-working imageable elements having improved solubility after imaging in lower pH developers.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), and U.S. Pat. No. 6,528,228 (Savariar-Hauck et al.), U.S. patent application Publication 2004/0067432 A1 (Kitson et al.). U.S. patent application Publication 2005/0037280 (Loccufier et al.) describes heat-sensitive printing plate precursors that comprise a phenolic developer-soluble polymer and an infrared radiation absorbing agent in the same layer.

Additional positive-working thermally imageable elements are described and used for making lithographic printing plates using various developers in U.S. Pat. No. 6,200,727 (Urano et al.), U.S. Pat. No. 6,358,669 (Savariar-Hauck et al), U.S. Pat. No. 6,534,238 (Savariar-Hauck et al.), and U.S. Pat. No. 6,555,291 (Savariar-Hauck).

Problem to be Solved

After thermal imaging, the imaged positive-working elements are developed to remove exposed regions of all layers to expose the hydrophilic substrate. There is a desire to use lower pH developers (pH 11 or less) as the non-image (non-exposed) regions are more hydrophilic and enables better press restart properties with less toning problems. This is true because the substrate interlayer is not removed during processing. However, the use of lower pH developers can lead to considerable residue builds up in the developer due to insufficient solubility of removed polymeric binders. Build up of sludge or residue causes a number of maintenance problems including the use of large filter units besides lowering the useful life of the developer. Thus, there is a desired to provide imaged elements (lithographic printing plates) in lower pH developers without a buildup of significant residue or sludge in the developers.

SUMMARY OF THE INVENTION

This invention provides a method of making an imaged lithographic element comprising:

A) imagewise exposing an imageable element using a source of infrared radiation to provide both exposed and non-exposed regions in the imageable element, and B) developing the imagewise exposed imageable element with a developer having a pH of from about 7 to about 11 to remove the exposed regions, wherein the imageable element comprises a substrate having thereon, in order:

an inner layer comprising a first polymeric binder, and an ink receptive outer layer comprising a second polymeric binder that: (1) is different than the first polymeric binder, (2) is soluble in the developer having a pH of from about 7 to about 11, and (3) is a poly(vinyl phenol) or derivative thereof, or a phenolic polymer that comprises recurring units represented by the following Structure (I):

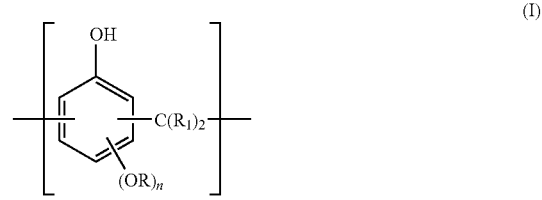

wherein R is hydrogen, $D_1$, or $D_2$, and $R_1$ is hydrogen or an alkyl group having 1 or 2 carbon atoms, n is 1, 2, or 3,

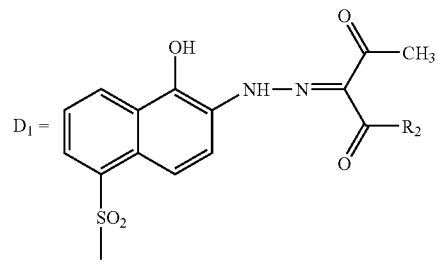

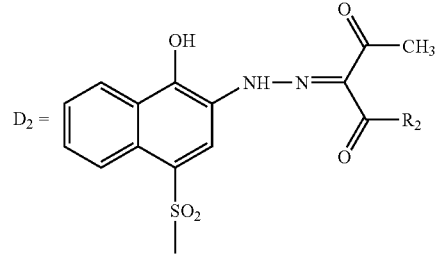

wherein $R_2$ is an alkyl or alkoxy group having 1 to 6 carbon atoms.

The present invention allows for the optimal use of "negative"-type developers, or developers having relatively lower pH (11 or less) to process positive-working imageable elements. These imageable elements contain polymeric binders in the outer layer that are very soluble in the lower pH developer. Thus, minimal residue or sludge builds up in the lower pH developers. An additional benefit for some embodiments is that the outer layer polymeric binder can provide insensitivity to "white light".

DETAILED DESCRIPTION OF THE INVENTION

Definitions

Unless the context indicates otherwise, when used herein, the terms "imageable element", "positive-working imageable element", and "printing plate precursor" are meant to be references to embodiments useful in the practice of the present invention.

In addition, unless the context indicates otherwise, the various components described herein such as "first polymeric binder", "second polymeric binder", "dissolution inhibitor", "added copolymer", "coating solvent", "infrared radiation absorbing compound", "developer", and similar terms also refer to mixtures of such components. Thus, the use of the article "a" or "an" is not necessarily meant to refer to only a single component.

By the term "remove said exposed regions" during development, we mean that the exposed regions of the outer layer and the corresponding regions of underlying layers are selectively and preferentially removed by the developer.

By "lower pH developer", we mean developers that have a pH of 11 or less, and generally a pH of from about 7 to about 11.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The positive-working imageable elements described herein can be used in a number of ways. The preferred use is as precursors to lithographic printing plates as described in more detail below. However, this is not meant to be their only use. For example, the imageable elements can also be used as thermal patterning systems and to form masking elements and printed circuit boards.

Imageable Elements

In general, the imageable element comprises a substrate, an inner layer (also known in the art as an "underlayer"), and an outer layer (also known in the art as a "top layer" or "topcoat") disposed over the inner layer. Before thermal imaging, the outer layer is generally not soluble or removable by a lower pH developer within the usual time allotted for development, but after thermal imaging, the exposed regions of the outer layer are soluble in the lower pH alkaline developer. The inner layer is also generally removable by the lower pH developer. An infrared radiation absorbing compound (defined below) can also be present in the imageable element, and is preferably present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described below prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, sodium phosphate/sodium fluoride, poly(vinyl phosphonic acid) (PVPA), vinyl phosphonic acid copolymer, poly(acrylic acid), or acrylic acid copolymer. Preferably, an electrochemically grained and anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

The inner layer is disposed between the outer layer and the substrate. Typically, it is disposed directly on the substrate. The inner layer comprises a first polymeric binder that is removable by the developer and preferably soluble in the developer to reduce sludging of the developer. In addition, the first polymeric binder is preferably insoluble in the solvent used to coat the outer layer so that the outer layer can be coated over the inner layer without dissolving the inner layer. Mixtures of these first polymeric binders can be used if desired in the inner layer.

Useful first polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. First polymeric binders that provide resistance both to fountain solution and aggressive washes are disclosed in U.S. Pat. No. 6,294,311 (noted above).

Particularly useful first polymeric binders include (meth) acrylonitrile polymers, and polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Preferred first polymeric binders of this type are copolymers that comprise from about 20 to about 75 mol % and preferably about 35 to about 60 mol % or recurring units derived from N-phenylmaleimide, N-cyclohexylmaleimide, N-(4-carboxyphenyl)maleimide, N-benzylmaleimide, or a mixture thereof, from about 10 to about 50 mol % and preferably from about 15 to about 40 mol % of recurring units derived from acrylamide, methacrylamide, or a mixture thereof, and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

The bakeable inner layers described in WO 2005/018934 (Kitson et al.) and U.S. Pat. No. 6,893,783 (Kitson et al.) may also be used.

Other useful first polymeric binders can comprise, in polymerized form, from about 5 mol % to about 30 mol % (preferably from about 10 mol % to about 30 mol % of recurring units) derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % (preferably from about 35 mol % to about 60 mol %) of recurring units derived from N-phenylmaleimide, N-cyclohexylmaleimide, or a mixture thereof, optionally, from about 5 mol % to about 50 mol % (preferably when present from about 15 mol % to about 40 mol %) of recurring units derived from methacrylamide, and from about 3 mol % to about 50 mol % (preferably from about 10 mol % to about 40 mol % of one or more recurring units derived from monomer compounds of the following Structure (IV):

$$CH_2=C(R_2)-C(=O)-NH-CH_2-OR_1 \quad (IV)$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek).

The first polymeric binder useful in the inner layer can also be hydroxy-containing polymeric material composed of recurring units derived from two or more ethylenically unsaturated monomers wherein from about 1 to about 50 mol % (preferably from about 10 to about 40 mol %) of the recurring units are derived from on or more of the monomers represented by the following Structure (V):

$$CH_2=C(R_3)C(=O)NR_4(CR_5R_6)_mOH \quad (V)$$

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20.

Preferred embodiments of hydroxy-containing first polymeric binders can be represented by the following Structure (VI):

$$-(A)_x-(B)_y-(C)_z- \quad (VI)$$

wherein A represents recurring units represented by the following Structure (VII):

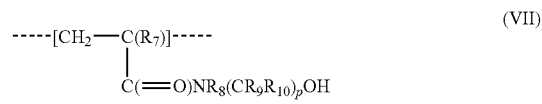

$$-----[CH_2-C(R_7)]----- \\ | \\ C(=O)NR_8(CR_9R_{10})_pOH \quad (VII)$$

wherein $R_7$ through $R_{10}$ and p are as defined the same as $R_3$ through $R_6$ and m noted above for Structure (V).

In Structure (VI), B represents recurring units comprising acidic functionality or an N-maleimide group, and C represents recurring units different from A and B, x is from about 1 to about 50 mol % (preferably from about 10 to about 40 mol %), y is from about 40 to about 90 mol % (from about 40 to about 70 mol %), and z is 0 to about 70 mol % (preferably from 0 to about 50 mol %), based on total recurring units.

In some embodiments of Structure (VI):

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (VII):

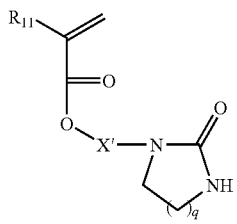

(VII)

wherein $R_{11}$ is hydrogen, methyl, or halo, X' is alkylene having 2 to 12 carbon atoms, q is 1 to 3, x is from about 10 to 40 mol %, y is from about 40 to about 70 mol %, and z is from 0 to about 50 mol %, all based on total recurring units.

In more preferred embodiments for Structure VI, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth)acrylic acid and vinyl benzoic acid in an amount of from about 10 to about 30 mol %, based on total recurring units.

In such embodiments, C represents recurring units derived from methacrylamide, (meth)acrylonitrile, maleic anhydride, or

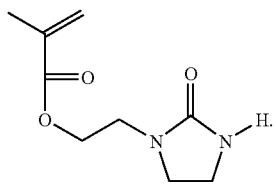

Still other useful first polymeric binders are addition or condensation polymers that have a polymer backbone to which are attached pendant phosphoric acid groups, pendant adamantyl groups, or both types of pendant groups. The pendant adamantyl groups are connected to the polymer backbone at least through a urea or urethane linking group but other linking groups can also be present.

Preferred first polymeric binders of this type can be represented by the following Structure (VIII):

(VIII)

wherein A and B together represents the polymer backbone in which A further comprises recurring units comprising pendant phosphoric acid groups, pendant adamantyl groups, or both, B further represents different recurring units, x represents 5 to 100 weight %, and y represents 0 to 95 weight %, provided that if A comprises pendant adamantyl groups, such groups are connected to the polymer backbone through a urea or urethane linking group (but other linking groups can also be present).

More preferably, such first polymeric binders can be represented by the following Structure (IX):

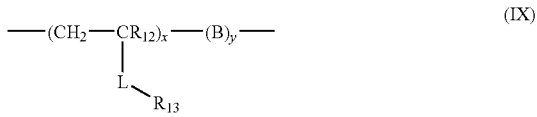

(IX)

wherein $R_{12}$ represents hydrogen, a substituted or unsubstituted lower alkyl group having 1 to 4 carbon atoms (such as methyl, ethyl, n-propyl, or t-butyl), or a halo group.

L represents a direct bond or a linking group comprising 1 or more carbon atoms and optionally 1 or more heteroatoms in the linking chain. Useful linking groups can include, but are not limited to, substituted or unsubstituted, linear or branched alkylene groups having 1 to 10 carbon atoms (such as methylene, methoxymethylene, ethylene, iso-propylene, n-butylene, t-butylene, and n-hexylene), substituted or unsubstituted cycloalkylene groups having 5 to 10 carbon atoms in the cyclic group (such as 1,3-cyclopentylene and 1,4-cyclohexylene), substituted or unsubstituted arylene groups having 6 to 10 carbon atoms in the cyclic group (such as 1,4-phenylene, 3-methyl-1,4-phenylene, or naphthylene), or combinations thereof, such as arylenealkylene, alkylenearylene, and alkylenearylenealkylene groups. The L linking groups can also include one or more oxy, thio, amido, carbonyl, oxycarbonyl, carbonyloxy, carbonamido, sulfonamido, urea, urethane, and carbonate [—O—C(=O)—O—] groups within the linking chain, with or without any of the alkylene, cycloalkylene, and arylene groups described above. L can include combinations of two or more of these groups.

Preferably, L is a direct bond or one or more of alkylene groups having 1 to 4 carbon atoms in the linking chain, carbonyloxy, urea, urethane, alkyleneoxy, alkylenecarbonyloxy, and carboxyalkylene groups. More preferably, L comprises at least one —C(=O)O— (carbonyloxy), —NH—C(=O)—NH— (urea), —C(=O)—O—(CH$_2$)$_2$—, or —NH—C(=O)—O— (urethane) group.

In Structure (IX), $R_{13}$ represents a pendant phosphoric acid group, a pendant adamantyl group, or both types of pendant groups. The solvent-resistant polymer can comprise one or more different recurring units having phosphoric acid groups or one or more different recurring units having adamantyl groups. Alternatively, the polymer can include a mixture of one or more different recurring units having phosphoric acid groups and one or more different recurring units having adamantyl groups. When R' is a pendant adamantyl group, L comprises a urea or urethane linking group within the linking chain.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

In more preferred embodiments of Structures VIII and IX, x is from about 5 to about 20 weight % and y is from about 80 to about 95 weight % when A represents recurring units comprising pendant phosphoric acid groups. Alternatively, x is from about 5 to about 40 weight % and B is from about 60 to about 95 weight % when A represents recurring units comprising pendant adamantyl groups.

Particularly useful ethylenically unsaturated polymerizable monomers that can used to provide the A recurring units described above for Structures VIII and IX include, but are not limited to the following compounds represented by the following Structures A1 through A5:

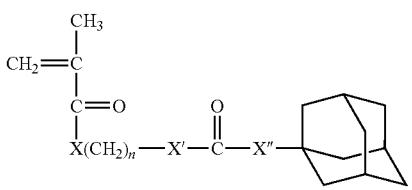
(A1)

wherein X is oxy, thio, or —NH— (preferably oxy), X' is —NH— or oxy, X" is oxy or —NH—, and n is 1 to 6 (preferably 2 to 4).

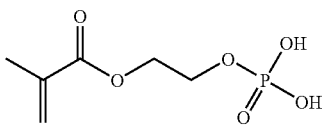
Ethylene glycol methacrylate phosphate (A2)

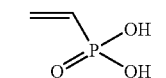
Vinyl phosphonic acid (A3)

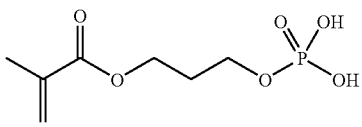
1, 3-Propylene glycol methacrylate phosphate (A4)

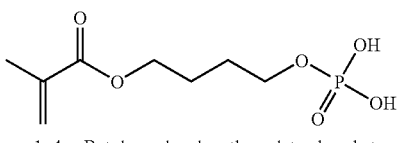
1, 4-n-Butylene glycol methacrylate phosphate (A5)

In Structures (VIII) and (IX), B represents recurring units derived from one or more ethylenically unsaturated polymerizable monomers that do not have pendant phosphoric acid groups or adamantyl groups. A variety of monomers can be used for providing B recurring units, including styrenic monomers, (meth)acrylamide, (meth)acrylic acids or esters thereof, (meth)acrylonitrile, vinyl acetate, maleic anhydride, N-substituted maleimide, or mixtures thereof.

Preferably, the recurring units represented by B are derived from styrene, N-phenylmaleimide, methacrylic acid, (meth)acrylonitrile, or methyl methacrylate, or mixtures of two or more of these monomers.

In some embodiments, the first polymeric binder can be represented by Structure (VIII) described above in which x is from about 5 to about 30 weight % (more preferably, from about 5 to about 20 weight %) and B represents recurring units derived from:
  a) one or more of styrene, N-phenylmaleimide, methacrylic acid, and methyl methacrylate, wherein these recurring units comprise from 0 to about 70 weight % (more preferably from about 10 to about 50 weight %) of all recurring units in the solvent-resistant polymer, and
  b) one or more of acrylonitrile or methacrylonitrile, or mixtures thereof, wherein these recurring units comprise from about 20 to about 95 weight % (more preferably from about 20 to about 60 weight %) of all recurring units in the solvent-resistant polymer.

Still other useful first polymeric binders comprise a backbone and have attached to the backbone the following Structure Q group:

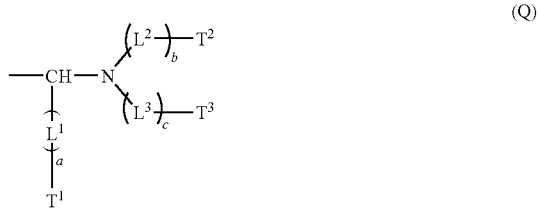
(Q)

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. Preferably, $L^1$ is a carbon-hydrogen single bond or a methylene, ethylene, or phenylene group, and $L^2$ and $L^3$ are independently hydrogen, methyl, ethyl, 2-hydroxyethyl, or cyclic —$(CH_2)_2O(CH_2CH_2)$— groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

In some embodiments, the Structure Q group can be directly attached to an α-carbon atom in the polymer backbone, the α-carbon atom also having attached thereto an electron withdrawing group. In other embodiments, the Structure Q group is indirectly attached to the polymer backbone through a linking group.

These first polymeric binders can be prepared by the reaction of an α-hydrogen in the polymer precursor with a first compound comprising an aldehyde group and a second compound comprising an amine group as described in U.S. patent application Publication 2005/0037280 (Loccufier et al.).

The first polymeric binders can also be represented by the following Structure (X):

wherein A represents recurring units derived from one or more ethylenically unsaturated polymerizable monomers that comprise the same or different Q groups, B represents recurring units derived from one or more different ethylenically unsaturated polymerizable monomers that do not comprise Q groups.

More particularly, the A recurring units in Structure X can be represented by the following Structure (Xa) or (Xb):

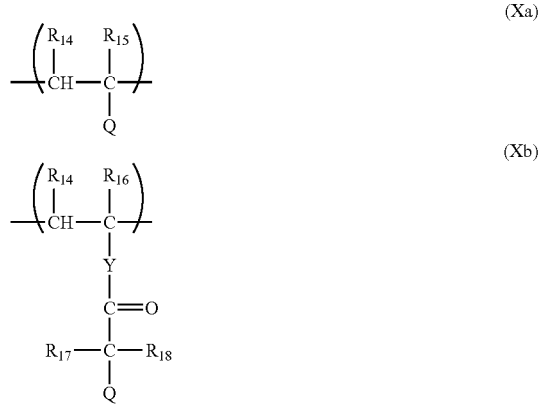

wherein $R_{14}$ and $R_{16}$ are independently hydrogen or a halo, substituted or unsubstituted alkyl having 1 to 7 carbon atoms (such as methyl, ethyl, n-propyl, iso-propyl, or benzyl), or a substituted or unsubstituted phenyl group. Preferably, $R_{14}$ and $R_{16}$ are independently hydrogen or a methyl or halo group, and more preferably they are independently hydrogen or methyl.

$R_{15}$ in Structure Xa is an electron withdrawing group as defined above including but are not limited to, cyano, nitro, substituted or unsubstituted aryl groups having 6 to 10 carbon atoms in the carbocyclic ring, substituted or unsubstituted heteroaryl groups having 5 to 10 carbon, sulfur, oxygen, or nitrogen atoms in the heteroaromatic ring, —C(=O)O$R_{20}$, and —C(=O)$R_{20}$ groups wherein $R_{20}$ is hydrogen or a substituted or unsubstituted alkyl having 1 to 4 carbon atoms (such as methyl, ethyl, n-propyl, t-butyl), a substituted or unsubstituted cycloalkyl (such as a substituted or unsubstituted cyclohexyl), or a substituted or unsubstituted aryl group (such as substituted or unsubstituted phenyl). The cyano, nitro, —C(=O)O$R_{20}$, and —C(=O)$R_{20}$ groups are preferred and cyano, —C(=O)CH$_3$, and —C(=O)OCH$_3$ are most preferred.

$R_{17}$ and $R_{18}$ in Structure (Xb) are independently hydrogen or a substituted or unsubstituted alkyl group having 1 to 6 carbon atoms (such as such as methyl, ethyl, n-propyl, t-butyl, n-hexyl), substituted or unsubstituted cycloalkyl having 5 or 6 carbon atoms (such as cyclohexyl), a substituted or unsubstituted aryl group having 6 to 10 carbon atoms (such as phenyl, 4-methylphenyl, and naphthyl), or a —C(=O)$R_{19}$ group wherein $R_{19}$ is a substituted or unsubstituted alkyl group (as defined for $R_{17}$ and $R_{18}$), a substituted or unsubstituted alkenyl group having 2 to 8 carbon atoms (such as ethenyl and 1,2-propenyl), a substituted or unsubstituted cycloalkyl group (as defined above for $R_{17}$ and $R_{18}$), or a substituted or unsubstituted aryl group (as defined above for $R_{17}$ and $R_{18}$). Preferably, $R_{17}$ and $R_{18}$ are independently hydrogen or a substituted or unsubstituted alkyl, cycloalkyl, aryl, or —C(=O)$R_{19}$ groups as defined above wherein $R_{19}$ is an alkyl having 1 to 4 carbon atoms.

In Structure (Xb), Y is a direct bond or a divalent linking group. Useful divalent linking groups include but are not limited to oxy, thio, —N$R_{21}$—, substituted or unsubstituted alkylene, substituted or unsubstituted phenylene, substituted or unsubstituted heterocyclylene, —C(=O)—, and —C(=O)O— groups, or a combination thereof wherein $R_{21}$ is hydrogen or a substituted or unsubstituted alkyl, substituted or unsubstituted cycloalkyl, or substituted or unsubstituted aryl group, as defined above for $R_{17}$ and $R_{18}$. Preferably, Y is a direct bond or an oxy, —C(=O)O—, —C(=O) OCH$_2$CH$_2$O—, or —C(=O)CH$_2$CH$_2$C(=O)CH$_2$— group.

In Structure (X), x is from about 1 to about 70 mol %, and y is from about 30 to about 99 mol %, based on total recurring units. Preferably, x is from about 5 to about 50 mol % and y is from about 50 to about 95 mol %, based on total recurring units.

Also in Structure (X), B can represent recurring units derived from a wide variety of ethylenically unsaturated polymerizable monomers. Particularly useful recurring units are derived from one or more N-substituted maleimides, N-substituted (meth)acrylamides, unsubstituted (meth)acrylamides, (meth)acrylonitriles, or vinyl monomers having an acidic group, and more preferably from one or more N-phenylmaleimides, N-cyclohexylmaleimides, N-benzylmaleimides, N-(4-carboxyphenyl)maleimides, (meth)acrylic acids, vinyl benzoic acids, (meth)acrylamides, and (meth)acrylonitriles. Several of these monomers can be copolymerized to provide multiple types of B recurring units. Particularly useful combinations of B recurring units include those derived from two or more of methacrylic acid, methacrylamide, and N-phenylmaleimide.

The first polymeric binders are the predominant polymeric materials in the inner layer. That is, they comprise more than 50% and up to 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % and preferably from about 3 to about 20 mole % of recurring units derived from N-phenylmaleimide, from about 1 to about 30 mole % and preferably from about 5 to about 20 mole % of recurring units derived from methacrylamide, from about 20 to about 75 mole % and preferably from about 35 to about 60 mole % of recurring units derived from acrylonitrile, and from about 20 to about 75 mole % and preferably from about 35 to about 60 mole % of recurring units derived from one or more monomers of the Structure (XI):

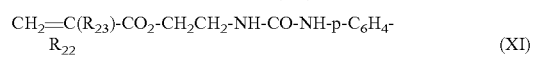

wherein $R_{22}$ is OH, COOH, or SO$_2$NH$_2$, and $R_{23}$ is H or methyl, and, optionally, from about 1 to about 30 mole % and preferably, when present, from about 3 to about 20 mole % of recurring units derived from one or more monomers of the Structure (XII):

$CH_2=C(R_{25})-CO-NH-p-C_6H_4-R_{24}$ (XII)

wherein $R_{24}$ is OH, COOH, or $SO_2NH_2$, and $R_{25}$ is H or methyl.

The inner layer may also comprise one or more secondary additional polymeric materials that are resins having activated methylol and/or activated alkylated methylol groups. These "secondary additional polymeric materials" in the inner layer should not be confused as the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % and about 35 to about 60 mole % of recurring units derived from N-phenylmaleimide, from about 10 to about 50 mole % and preferably from about 15 to about 40 mole % of recurring units derived from methacrylamide, and from about 5 to about 30 mole % and preferably from about 10 to about 30 mole % of recurring units derived from methacrylic acid. These secondary additional copolymers are disclosed in U.S. Pat. Nos. 6,294,311 and 6,528,228 (both noted above).

The first polymeric binder and the primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In preferred embodiments, the inner layer further comprises an infrared radiation absorbing compound ("IR absorbing compounds") that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigments such as iron oxides and carbon blacks. Examples of useful pigments are ProJet 900, ProJet 860 and ProJet 830 (all available from the Zeneca Corporation).

In most preferred embodiments, the infrared radiation absorbing compound is present only in the inner layer.

Useful infrared radiation absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR absorbing dyes (especially those that are soluble in an alkaline developer) are more preferred to prevent sludging of the developer by insoluble material. Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Dye A used in the Examples below.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The infrared radiation absorbing compound can be present in the imageable element in an amount of generally at least 3% and up to 30% and preferably from about 5 to about 25%, based on the total dry weight of the element. Preferably, this amount is based on the total dry weight of the layer in which it is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m² and preferably from about 1 to about 2 g/m². The first polymeric binders described above generally comprise at least 50 weight % and preferably from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % and preferably from about 5 to about 25 weight % based on the total dry weight of the inner layer.

The outer layer of the imageable element is disposed over the inner layer and in preferred embodiments there are no intermediate layers between the inner and outer layers. The outer layer comprises a second polymeric binder that is different than the first polymeric binder described above. It is generally a light-stable, water-insoluble, lower pH developer soluble, film-forming binder material as defined below. The outer layer is substantially free of infrared radiation absorbing compounds, meaning that none of these compounds are purposely incorporated therein and insubstantial amounts diffuse into it from other layers.

This second polymeric binder can be a poly(vinyl phenol) or derivative thereof. Such polymers are generally derived from one or more polymerizable monomers having a pendant substituted or unsubstituted phenolic group such as hydroxystyrene and substituted derivatives thereof. The preferred molecular weight for such polymeric binders is at least 1,000 and up to 40,000 number average molecular weight, and more preferably from about 4,000 to about 20,000 number average molecular weight, as measured using known techniques.

Preferred second polymeric binders comprise recurring units represented by the following Structure (I):

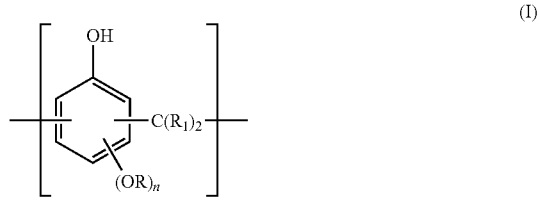

(I)

wherein R is hydrogen, $D_1$, or $D_2$ (shown below) and $R_1$ is hydrogen or a substituted or unsubstituted alkyl group having 1 or 2 carbon atoms (such as methyl, ethyl, and methoxymethyl groups), n is 1, 2, or 3,

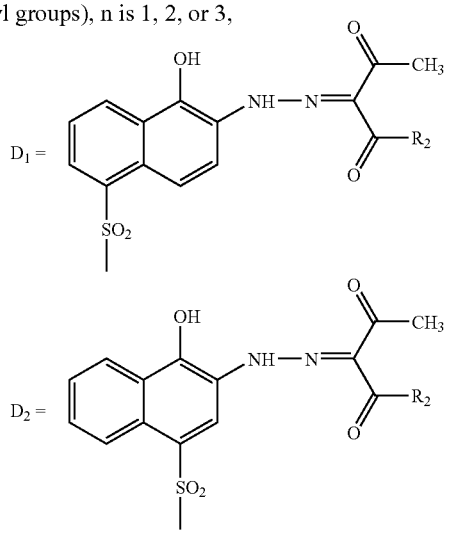

wherein $R_2$ is a substituted or unsubstituted alkyl or alkoxy group having 1 to 6 carbon atoms (such as methyl, methoxymethyl, ethyl, isopropyl, t-butyl, n-hexyl, and the corresponding alkoxy groups).

Preferably, R is $D_1$ or $D_2$, $R_1$ is hydrogen or unsubstituted methyl, and $R_2$ is a substituted or unsubstituted alkyl or alkoxy group having 1 to 4 carbon atoms.

The second polymeric binder of Structure (I) generally has a number average molecular weight of at least 400 and up to 10,000 and preferably from about 1,500 to about 4,500, as measured using known techniques.

Preferred second polymeric binders can also be represented by the following Structure (II):

(II)

wherein A represents recurring units represented by Structure (I), and B represents different recurring units, x is about 20 to 100 mol % (preferably from about 40 to 100 mol %), and y is from 0 to about 80 mol % (preferably from 0 to about 60 mol %).

In Structure (II), B represents recurring units other than those represented by A. They can be derived from one or more ethylenically unsaturated polymerizable monomers that are capable of copolymerizing with the monomers from which the A recurring units are derived, including maleic acid anhydride. Representative useful monomers for the B recurring units include but are not limited to, (meth)acrylates, (meth) acrylamides, vinyl ethers, vinyl esters, vinyl ketones, olefins, unsaturated imides including N-maleimides, unsaturated anhydrides such as maleic anhydrides, N-vinyl pyrrolidone, N-vinyl carbazole, 4-vinyl pyridine, (meth)acrylonitriles, or styrenic monomers, or any combinations of these monomers. Specific monomers of these and similar classes are described for example, in paragraphs [0044] through [0054] of U.S. patent application Publication 2004/0137366 (corresponding to EP 1,433,594A) that is incorporated herein by reference.

Preferably, B represents recurring units for Structure (II) that are derived from one or more (meth)acrylates, (meth) acrylonitriles, N-phenylmaleimide, or (meth)acrylamides such as N-alkoxyalkylmethacrylamides, or combinations of two or more of such monomers. Some particularly useful monomers from which B recurring units are derived include methyl methacrylate, styrene, ethylenically unsaturated polymerizable monomers having pendant cyclic urea groups, and combinations thereof.

Particularly useful second polymeric binders are identified and demonstrated in use as PA300, PEAC, and poly(vinyl phenols) in the Examples below.

The second polymeric binders can be obtained from several commercial sources including PCAS (France) and Aldrich Chemical Company.

Alternatively, the second polymeric binders useful in this invention can be prepared using a variety of methods. For example, poly(vinyl phenol)s can be readily prepared by free radical polymerization of for example, p-acetoxystyrene and subsequent hydrolysis to obtain the p-hydroxystyrene polymer (see for example Col. 5, line 16 of U.S. Pat. No. 6,200, 727). The reactants and conditions for these reactions would be readily apparent to one skilled in the art, for example as described in Chapters 20 and 21 of *Macromolecules*, Vol. 2, $2^{nd}$ Ed. by H. G. Elias, Plenum, N.Y. 1984.

Second polymeric binders represented by Structure (I) are phenolic resins prepared as condensation products of polyhydroxy substituted aromatic compounds such as pyrogallol and resorcinol with, for example, acetone or formaldehyde. The PA300 used in the Examples below is a second polymeric binder prepared in this manner.

Also useful second polymeric binders are those represented by Structure (I) above that are o-quinonediazide derivatives of resins that have been reacted with an active methylene compound in order to make the o-quinonediazide groups non-photosensitive. For example, a novolak resin can be partially esterified with 5-napthoquinone diazide sulfonyl chloride (or a corresponding derivative thereof), followed by reaction with acetyl acetone using potassium t-butoxide as a catalyst. Further details of such reactions are provided in U.S. Pat. No. 6,200,727 (Urano et al.) The PEAC A used in the Examples below is an example of a polymeric binder prepared in this manner.

The one or more second polymeric binders are present in the outer layer at a dry coverage of from about 15 to 100 weight %, preferably from about 70 to about 98 weight %, based on total dry weight of the outer layer.

The outer layer can preferably include colorants. Particularly useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element.

The outer layer can optionally also include contrast dyes, printout dyes, coating surfactants, dispersing aids, humectants, biocides, viscosity builders, drying agents, defoamers, preservatives, and antioxidants.

Preferably, the outer layer is free of what are known in the art as "solubility-suppressing components", that is compounds that would reversibly suppress the solubility of the second polymeric binder in the developer.

The outer layer generally has a dry coating coverage of from about 0.2 to about 2 $g/m^2$ and preferably from about 0.4 to about 1.5 $g/m^2$.

Although not preferred, there may be a separate layer that is between and in contact with the inner and outer layers. This separate layer can act as a barrier to minimize migration of radiation absorbing compound(s) from the inner layer to the outer layer. This separate "barrier" layer generally comprises a third polymeric binder that is soluble in the alkaline developer. If this third polymeric binder is different from the first polymeric binder(s) in the inner layer, it is preferably soluble in at least one organic solvent in which the inner layer first polymeric binders are insoluble. A preferred third polymeric binder is a poly(vinyl alcohol). Generally, this barrier layer should be less than one-fifth as thick as the inner layer, and preferably less than one-tenth as thick as the inner layer.

Alternatively, there may be a separate layer between the inner and outer layers that contains the infrared radiation absorbing compound(s), which may also be present in the inner layer, or solely in the separate layer.

Preparation of the Imageable Element

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (preferably at least 20 hours) under conditions that inhibit the removal of moisture from the dried layers. More preferably, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil.

Representative methods for preparing imageable elements useful in this invention are shown in Examples 1-3 below.

The imageable elements can have any useful form including, but not limited to, printing plate precursors, printing cylinders, printing sleeves and printing tapes (including flexible printing webs). Preferably, the imageable members are printing plate precursors useful for providing lithographic printing plates.

Printing plate precursors can be of any useful size and shape (for example, square or rectangular) having the requisite inner and outer layers disposed on a suitable substrate. Printing cylinders and sleeves are known as rotary printing members having the substrate and inner and outer layers in a cylindrical form. Hollow or solid metal cores can be used as substrates for printing sleeves.

Imaging and Development

During use, the imageable element is exposed to a suitable source of infrared using an infrared laser at a wavelength of from about 600 to about 1500 nm and preferably from about 700 to about 1200 nm. The lasers used to expose the imageable elements are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm², and more particularly from about 75 to about 400 mJ/cm².

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Imaging is generally carried out by direct digital imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable lower pH developer removes the exposed regions of the outer layer and the underlying portions of underlayers (including the inner layer), and exposes the hydrophilic surface of the substrate. Thus, the imageable elements are "positive-working". The exposed (or imaged) regions of the hydrophilic surface repel ink while the non-exposed (or non-imaged) regions of the outer layer accept ink.

More particularly, development is carried out for a time sufficient to remove the exposed regions of the imaged element, but not long enough to remove the non-exposed regions. Because of the nature of the second polymer binder(s) used in the outer layer, removal of the exposed regions readily occurs during development but the removed portions of the outer layer are readily soluble in the lower pH developer, thereby reducing sludge or residue in the developer.

The imaged elements are generally developed using conventional processing conditions using the lower pH developers described below. These developers generally have a pH of 11 or less and preferably from about 7 to about 11, and more preferably from about 7 to about 10.

These lower pH developers used in the present invention are generally single-phase solutions of water and one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. The developer preferably comprises benzyl alcohol, 2-phenoxyethanol, or both.

Representative lower pH developers useful in this invention include but are not limited to, ND-1 Developer, 955 Developer, 956 Developer, 989 Developer, and 980 Developer (all available from Eastman Kodak Company), HDN-1 Developer (available from Fuji), and EN 232 Developer (available from Agfa). These lower pH developers can be used to advantage in the methods of this invention in combination with second polymeric binder in the outer layer to leave minimal residue.

Generally, the lower pH developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element is preferably immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. Ink is taken up by the non-exposed regions of the outer layer and fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows. Unless otherwise indicated, the components can be obtained from various commercial sources such as Aldrich Chemical Co. (Milwaukee, Wis.).

BLO is γ-butyrolactone.

Byk® 307 is a polyethoxylated dimethylpolysiloxane copolymer that is available from Byk Chemie (Wallingford, Conn.) in a 25 wt. % xylene/-methoxypropyl acetate solution.

Copolymer A represents a copolymer having recurring units derived from N-phenylmaleimide, methacrylamide, and methacrylic acid (45:35:20 mol %) using conventional conditions and procedures.

Copolymer B represents a copolymer having recurring units derived from methacrylic acid, acrylonitrile, N-phenyl-maleimide, and methacryl-amide (10/30/30/30 wt. %) using conventional conditions and procedures.

Copolymer C represents a copolymer having recurring units derived from N-phenylmaleimide (40 mole %), methacrylamide (19 mole %), methacrylic acid (15 mole %), and N-(2-methacryloyloxyethyl)ethylene urea (26 mole %) with an acid number of 57. N-(2-methacryloyloxyethyl)ethylene urea and methacrylic monomers are available from Degussa Huels (Germany).

DEK represents diethyl ketone.

Dowanol® PM is propylene glycol methyl ether that was obtained from Dow Chemical (Midland, Mich.). It is also known as PGME.

Ethyl violet is assigned C.I. 42600 (CAS 2390-59-2, $\lambda_{max}$=596 nm) and has a formula of p-$(CH_3CH_2)_2NC_6H_4)_3C^+$ $Cl^-$.

IR Dye A (Trump) is represented by the following formula and can be obtained from Eastman Kodak Company (Rochester, N.Y.):

IR Dye A

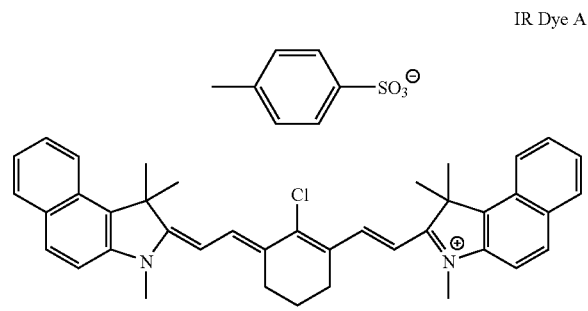

Maruka Lyncur M (S-4) is a poly(vinyl phenol) that was obtained from Sieber Hegner (Italy).

MEK represents methyl ethyl ketone.

P3000 is a pyrogallol-acetone novolac derivatized with naphthoquinonediazide that was obtained from PCAS (France) and has the following structure:

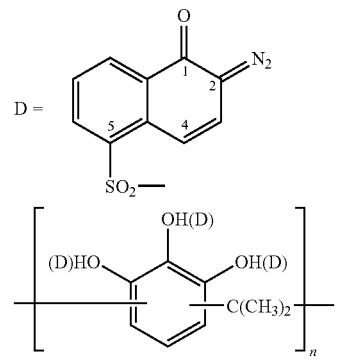

PA300 is a pyrogallol-Acetone condensed product that was obtained from PCAS.

PD140A is a novolac resin that was obtained from Borden Chemical (Columbus, Ohio) and has the following structure:

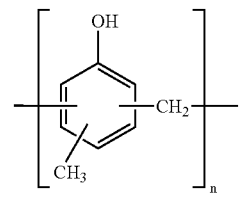

m/p = 75/25

PEAC A represents a pyrogallol-acetone product that was condensed with naphthoquinone diazide (NQD) that has been further reacted with acetyl-acetone and has the following general structure:

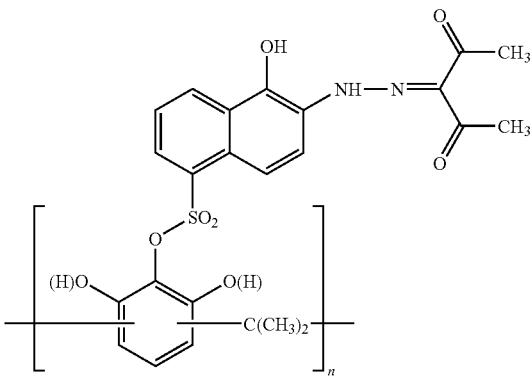

PMA represents 1-methoxy-2-propyl acetate.

Substrate A is a 0.3 mm gauge aluminum sheet that had been electrograined, anodized, and subjected to treatment poly(vinyl phosphonic acid).

980 Developer is a negative developer that is available from Eastman Kodak Company.

Example 1

An imageable element of the present invention was prepared as follows:

An inner layer formulation was prepared by dissolving Copolymer A (5.0 g) and IR Dye A (0.7 g) in 90 ml of a solvent mixture comprising MEK (45 wt. %), PMA (35 wt. %), BLO (10 wt. %), and water (10 wt. %) and coating it onto Substrate A and dried at 135° C. for 45 seconds to provide a dry coating weight of 1.35 g/m².

An outer layer formulation was prepared by dissolving PA300 (2.4 g), 0.012 g Byk® 307 (0.012 g), and Ethyl violet (0.013 g) in 20 g of a solvent mixture (diethyl ketone:Dowanol® PM, 9:1 weight ratio) and coated over the dried inner layer and dried at 135° C. for 45 seconds to provide a dry coating weight of 0.57 g/m².

Samples of the resulting imageable element were imaged with test patterns at 9W and drum speeds between 150 rpm and 360 rpm (or between 67 and 161 mJ/cm²) in steps of 30 rpm on a Creo® Quantum 800 imagesetter. The imaged elements were developed with 980 Developer in a Glunz and Jensen processor at 120 cm/min to provide lithographic printing plates having a good image with excellent resolution and clean background at exposures above 93 mJ/cm².

The solubility of PA300 in the 980 Developer was evaluated by adding 0.3 g of the PA300 to 30 ml of the developer during stirring. The resin dissolved completely without any residue within 2 hours.

The UV/white light sensitivity of the imageable element was tested by exposing it to 250 mJ/cm² UV flood exposure. This element was then imaged and developed as described above to provide a lithographic printing plate. No difference in the image quality was seen between the two printing plates.

Example 2

Another imageable element of this invention was prepared as follows:

An inner layer formulation was prepared by dissolving Copolymer B (4.5 g) and IR Dye A (0.7 g) in 90 ml of a solvent mixture comprising MEK (45 wt. %), PMA (35 wt. %), BLO (10 wt. %), and water (10 wt. %) and coated onto Substrate A and dried at 135° C. for 45 seconds to provide a dry coating weight of 1.32 g/m².

An outer layer was prepared by dissolving PA300 (2.4 g), Byk® 307 (0.012 g), and Ethyl violet (0.013 g) in 20 g of a solvent mixture (diethyl ketone:Dowanol® PM, 9:1 weight ratio) and coated over the dried inner layer and dried at 135° C. for 45 seconds to provide a dry coating weight of 0.57 g/m².

Samples of the resulting imageable element were imaged with test patterns at 9W and drum speeds between 150 rpm and 360 rpm (that corresponds to 67 to 161 mJ/cm²) in steps of 30 rpm on a Creo® Quantum 800 imagesetter. The imaged element samples were developed using 980 Developer in a Glunz and Jensen processor at 120 cm/min to provide lithographic printing plates having a good image with excellent resolution and clean background at exposures above 89 mJ/cm².

Example 3

Another imageable element of the present invention was prepared in the following manner.

An inner layer formulation was prepared by dissolving Copolymer C (4.5 g) and IR Dye A (0.7 g) in 90 ml of a solvent mixture comprising MEK (45 wt. %), PMA (35 wt. %), BLO (10 wt. %), and water (10 wt. %) and coating it onto Substrate A and dried at 135° C. for 45 seconds to provide a dry coating weight of 1.32 g/m².

An outer layer formulation was prepared by dissolving PEAC A (2.4 g), 0.012 g Byk® 307 (0.012 g), and Ethyl violet (0.013 g) in 20 g of a solvent mixture (diethyl ketone:Dowanol® PM, 9:1 weight ratio) and coated over the dried inner layer and dried at 135° C. for 45 seconds to provide a dry coating weight of 0.57 g/m².

Samples of the resulting imageable element were imaged with test patterns at 9W and drum speeds between 150 rpm and 360 rpm (that corresponds to from 67 to 161 mJ/cm²) in steps of 30 rpm on a Creo® Quantum 800 imagesetter. The imaged element samples were developed with 980 Developer in a Glunz and Jensen processor at 120 cm/min to provide lithographic printing plates having a good image with excellent resolution and clean background at exposures above 89 mJ/cm².

The solubility of PEAC A in the 980 Developer was evaluated by adding 0.3 g of the PEAC A to 30 ml of the developer during stirring. The resin dissolved completely without any residue within 2 hours.

The UV/white light sensitivity of the imageable element was tested by exposing it to 250 mJ/cm² UV flood exposure. This element was then imaged and developed as described above to provide a lithographic printing plate. No difference in the image quality was seen between the two printing plates.

Example 4

An inner layer formulation was prepared, coated and dried as described above in Example 3.

An outer layer formulation was prepared by dissolving Resin M (2.5 g) in 30 ml of diethyl ketone and coated over the inner layer, dried at 135° C. for 45 seconds to provide a dry coating weight of the outer layer of 0.80 g/m². Samples of the resulting imageable element were imaged with test patterns at 9W and drum speeds between 150 rpm and 360 rpm (that corresponds to 67-161 mJ/cm²) in steps of 30 rpm on a Creo® Quantum 800 platesetter. The imaged element samples were developed with 980 Developer in a Glunz and Jensen at 120 cm/min to provide lithographic printing plates having a good image with excellent resolution and clean background at exposures above 89 mJ/cm².

The solubility of Resin M in the 980 Developer was evaluated by adding 0.3 g of the Resin M to 30 ml of the developer during stirring. The resin dissolved completely without any residue within 2 hours.

The UV/white light sensitivity of the imageable element was tested by exposing it to 250 mJ/cm² UV flood exposure. This element was then imaged and developed as described above to provide a lithographic printing plate. No difference in the image quality was seen between the two printing plates.

Comparative Example 1

An imageable element outside of this invention was prepared as follows:

An inner layer formulation was prepared, coated and dried as described above in Example 1.

An outer layer formulation was prepared by dissolving PD140A (2.5 g) in 30 ml of butyl acetate and coated over the inner layer, dried at 135° C. for 45 seconds to provide a dry coating weight of the outer layer of 0.55 g/m².

Samples of the resulting imageable element were imaged with test patterns at 9W and drum speeds between 150 rpm and 360 rpm (that corresponds to 67-161 mJ/cm²) in steps of 30 rpm on a Creo® Quantum 800 platesetter. The imaged element samples were developed with 980 Developer in a Mercury processor at 900 mm/min to provide printing plates having a good image with excellent resolution and clean background at exposures above 93 mJ/cm².

The solubility of PD 140A was evaluated by stirring 0.3 g of the polymer in 30 ml of 980 Developer. After 24 hours, there was no sign of solubility of the polymer in the developer. This would result in considerable residue in the processor after developing multiple imaged elements containing PD140A in the outer layer.

Comparative Example 2

An imageable element outside of this invention was prepared as follows:

An inner layer formulation was prepared, coated and dried as described above in Example 1.

An outer layer formulation was prepared by dissolving PD140A (4.8 g), P3000 (2.1 g), Ethyl violet (0.03 g), and Byk® 307 (0.04 g) in 100 ml of DEK and coated over the inner layer, dried at 135° C. for 45 seconds to provide a dry coating weight of the outer layer of 0.56 g/m².

Samples of the resulting imageable element were imaged with test patterns at 9W and drum speeds between 150 rpm and 360 rpm (that corresponds to 67-161 mJ/cm²) in steps of 30 rpm on a Creo® Quantum 800 platesetter. The imaged element were developed with 980 Developer for 30 seconds to provide printing plates having a good image with excellent resolution and clean background at exposures above 101 mJ/cm².

The solubility of PD140A with P3000 was evaluated by stirring 0.2 g of PD104A and 0.1 of P3000 in 30 ml of 980 Developer. Insoluble residue was observed in the developer, showing that this outer layer composition can lead to filter blockage and redeposition problems in the processor.

The UV light sensitivity of the imageable element was evaluated by exposing it to 250 mJ/cm² UV flood exposure. The element was then imaged and processed as described above. Strong image attack and poor image quality were observed.

Comparative Example 3

Still another imageable element outside of the present invention was prepared as follows:

An inner layer formulation was prepared, coated and dried as described above in Example 1.

An outer layer formulation was prepared by dissolving P3000 (2.5 g) in 30 ml of DEK and coated over the inner layer, dried at 135° C. for 45 seconds to provide a dry coating weight of the outer layer of 0.55 g/m².

Samples of the resulting imageable element were imaged with test patterns at 9W and drum speeds between 150 rpm and 360 rpm (that corresponds to 67-161 mJ/cm²) in steps of 30 rpm on a Creo® Quantum 800 platesetter. The imaged element samples were developed with 980 Developer in a Mercury processor for 900 mm/min to provide printing plates having a good image with excellent resolution and clean background at exposures above 93 mJ/cm².

The solubility of P3000 was evaluated by stirring 0.3 of P3000 in 30 ml of 980 Developer. After 24 hours, there was no sign of solubility of the polymer in the developer.

The UV light sensitivity of the imageable element was evaluated by exposing it to 250 mJ/cm² UV flood exposure. The element was then imaged and processed as described above. Strong image attack and poor image quality were observed.

The invention has been described in detail with particular reference to certain preferred embodiments thereof, but it will be understood that variations and modifications can be effected within the spirit and scope of the invention.

What is claimed is:

1. A method of making an imaged lithographic element comprising:
   A) imagewise exposing an imageable element using a source of infrared radiation to provide both exposed and non-exposed regions in said imageable element, and
   B) developing said imagewise exposed imageable element with a developer having a pH of from about 7 to about 11 to remove said exposed regions,
   wherein said imageable element comprises a substrate having thereon, in order:
   an inner layer comprising a first polymeric binder, and
   an ink receptive outer layer comprising a second polymeric binder that: (1) is different than said first polymeric binder, (2) is soluble in said developer having a pH of from about 7 to about 11, and (3) is a phenolic polymer that is represented by the following Structure (II):

$$-(A)_x-(B)_y-\qquad (II)$$

wherein A represents recurring units represented by Structure (I) below, and B represents different recurring units, x is about 20 to 100 mol %, and y is from 0 to about 80 mol %,

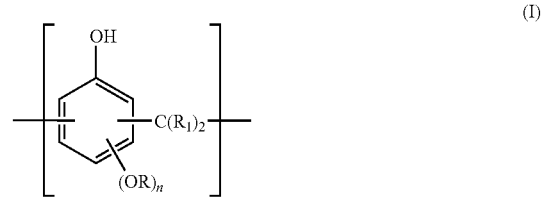

wherein R is hydrogen, $D_1$, or $D_2$, and $R_1$ is hydrogen or an alkyl group having 1 or 2 carbon atoms, n is 1, 2, or 3,

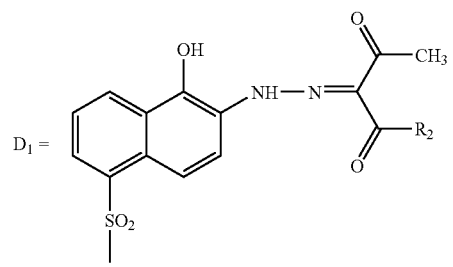

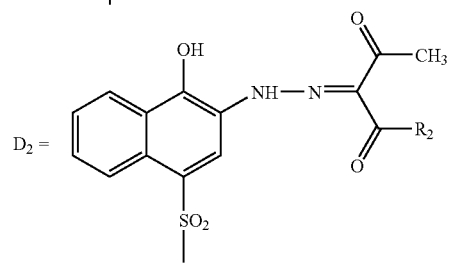

wherein $R_2$ is an alkyl or alkoxy group having 1 to 6 carbon atoms.

2. The method of claim 1 wherein said second polymeric binder is present in said outer layer at a dry coverage of from about 15 to 100 weight % based on total dry weight of said outer layer.

3. The method of claim 1 wherein said outer layer is free of solubility-suppressing components.

4. The method of claim 1 wherein said imageable element further comprises an infrared radiation absorbing compound.

5. The method of claim 4 wherein said infrared radiation absorbing compound is an IR absorbing dye having a maximum absorption at from about 700 to about 1200 nm and is present in said inner layer in an amount of at least 3 weight %.

6. The method of claim 1 wherein said first polymeric binder is a (meth)acrylic resin comprising carboxy groups, a maleated wood rosin, a styrene-maleic anhydride copolymer, a (meth)acrylamide polymer, a (meth)acrylonitrile polymer, a polymer derived from an N-substituted cyclic imide, a polymer having pendant cyclic urea groups, and polymers derived from an N-alkoxyalkyl methacrylamide.

7. The method of claim 1 wherein said inner layer has a dry coating coverage of from about 0.5 to about 2.5 g/m$^2$ and said outer layer has a dry coating coverage of from about 0.2 to about 2 g/m$^2$.

8. The method of claim 1 wherein said developer comprises benzyl alcohol, 2-phenoxyethanol, or both.

9. The method of claim 1 wherein R is $D_1$ or $D_2$.

10. The method of claim 1 wherein $R_1$ is hydrogen or methyl.

11. The method of claim 1 wherein $R_2$ is an alkyl or alkoxy group having 1 to 4 carbon atoms.

* * * * *